United States Patent [19]

Moreau

[11] Patent Number: 5,298,788
[45] Date of Patent: Mar. 29, 1994

[54] AVALANCHE DIODE IN A BIPOLAR INTEGRATED CIRCUIT

[75] Inventor: Jean-Michel Moreau, Grenoble, France

[73] Assignee: SGS-Thomson Microelectronics S.A., Gentilly, France

[21] Appl. No.: 904,054

[22] Filed: Jun. 26, 1992

[30] Foreign Application Priority Data

Jun. 28, 1991 [FR] France .................. 91 08418

[51] Int. Cl.$^5$ .................. H01L 29/90; H01L 27/02
[52] U.S. Cl. .................. 257/606; 257/603; 257/577; 257/548; 257/511
[58] Field of Search .................. 257/603–606, 257/577, 548, 511

[56] References Cited

U.S. PATENT DOCUMENTS

| | | | |
|---|---|---|---|
| 4,276,556 | 6/1981 | Enomoto et al. | 257/577 |
| 4,319,257 | 3/1982 | Beasom | 257/606 |
| 4,441,114 | 4/1984 | Muggli | 257/606 |
| 4,758,872 | 7/1988 | Hada | 257/577 |
| 4,766,469 | 8/1988 | Hill | 257/577 |
| 4,910,160 | 3/1990 | Jennings et al. | 257/548 |
| 5,027,165 | 6/1991 | Doluca | |

*Primary Examiner*—Rolf Hille
*Assistant Examiner*—Mahshid Sadat
*Attorney, Agent, or Firm*—Lowe, Price, LeBlanc & Becker

[57] ABSTRACT

An avalanche diode is formed in an N layer (20) of a bipolar integrated circuit. The diode comprises a first (P) region (22) and N region (21) disposed inside the first region. The portion of the first region which resides under the N region and close to the interface with the latter has a first doping level. A second (P) region (23) extends under the N region with a second doping level higher than the first close to the junction. A third P region (30) is disposed under the N region and overlaps the second P region. The third region has, at its interface with the N region, a doping level intermediate the first and second doping levels.

4 Claims, 3 Drawing Sheets

AVALANCHE DIODE IN A BIPOLAR INTEGRATED CIRCUIT

BACKGROUND OF THE INVENTION

The present invention relates to the field of bipolar integrated circuits, and more particularly to avalanche diodes designed to serve as voltage references in such circuits.

Avalanche diodes have been thoroughly studied, and it is known, when discrete components are achieved, how to obtain satisfactory avalanche diodes. However, when manufacturing integrated circuits, numerous requirements are to be met, namely, a large number of elementary components are simultaneously achieved and all these components have to be achieved with a minimum number of manufacturing steps.

FIG. 1 is intended to review the main technological steps and structures achievable in a bipolar integrated circuit. Such a circuit is generally achieved on a substrate 1 of a first (generally P) conductivity type, on which is formed an epitaxial layer 2 of a second conductivity type (N). At the interface between the substrate 1 and the epitaxial layer 2 can be formed N+-type buried layers, resulting from a dopant implantation carried out in the substrate prior to epitaxial growth. The epitaxial layer is divided into wells by P+-type deep diffused regions 5 or by regions 6 with shallower diffusions extending from the surface and joining regions 7 resulting from a P-type implantation in the surface of the substrate 1 prior to epitaxy. In each well, provided or not with a buried layer, it is then possible to form various types of components. The prevalent component is the NPN transistor comprising a P region 10 corresponding to the base of an NPN transistor. Inside this P region 10 is formed an N+-type region 11 corresponding to the transistor emitter. These P and N+ diffusions, 10 and 11, respectively, can be used in structures other than an NPN transistor. However, they are still called, when it is desired to designate their nature and their doping type, P base diffusions for the regions formed simultaneously with the base and N emitter diffusions for regions formed simultaneously with the emitters of the NPN transistors. For example, the collector contact of the NPN transistor is achieved on an N+ region 12 which is an N emitter diffusion. Moreover, as shown in the right-hand portion of FIG. 1, P+-type regions 13 are generally provided, serving, for example, as emitter and collector for PNP power transistors.

To sum up, from the surface of an N type well, it is possible to form:
- a first P-type region corresponding to the base of the NPN transistors,
- second P-type region corresponding to the emitters of the PNP transistors,
- a third P-type region corresponding to an insulation diffusion (entire insulation diffusion such as diffusion 5 or partial insulation diffusion such as diffusion 6),
- an N+-type diffusion corresponding to the emitters of the NPN transistors.

A priori, it is possible to form avalanche diodes by reversely biasing a junction formed from two regions of opposite type among the above regions.

In practice, one of the avalanche diode structures which gives the most satisfactory results is a structure of the type illustrated in the cross section view of FIG. 2A and in the top view of FIG. 2B. This avalanche diode is formed in an N well 20 (the underlying P substrate is not shown). The avalanche diode comprises an N+ emitter region 21 formed in a P base region 22. Substantially in the middle of region 21 a highly doped P diffusion 23 has been previously formed, so that it is the interface between the N region 21 and the P region 23 which corresponds to the junction liable to provide the avalanche effect. This is intended to provide on both sides of the junction substantially homogeneous concentrations of N dopant and P dopant so that the avalanche surface is clearly defined. Indeed, in the absence of region 23, the avalanche junction would be the junction between region 21 and region 22. Since the P region 22 has been obtained through diffusion, its doping level is higher at the surface than depthwise and the avalanche would tend to occur preferably near the surface, which causes numerous drawbacks as regards the definition of the junction surface liable to be set to avalanche mode and as regards the characteristics of the avalanche junction since the upper surfaces of a layer are the most likely to be polluted and damaged with age. Indeed, moving electrical charges may happen to be in the oxide coating the junction surfaces. The presence of these charges changes the avalanche conditions, causing excessive noise and often a change in time of the avalanche voltage value.

Of course, the N+ region 21 is substantially more highly doped than the P+ region 23 so that all this N+ region has substantially the same doping level, even where the upper portion of P+ region 23 was formed. The P+ region 23 can, for example, correspond to a P emitter region of the PNP transistor or to a P insulation region. A metallization 24 is provided on the N region 21 and a metallization 25 is provided on the apparent surface of the P region 22.

Thus, the described structure provide a satisfactory definition of the avalanche voltage. Preferably, the area of the junction between layers 21 and 23 is as small as possible so that the current density in this diode is relatively high, which provides a more reliable definition (less noisy) of the avalanche voltage, necessary for defining a reference voltage. However, a drawback of this structure is that the avalanche current will flow through the annular portion of P region 22, designated by resistance $R_1$, pinched between the N+ diffusion 21 and the epitaxial layer 20. This pinched region has a relatively high resistance which is defined with a relative inaccuracy and which depends upon the accuracy of the relative positioning of regions 21 and 23. Hence, the avalanche voltage which is accurately defined at the junction between regions 21 and 23 is less accurately defined between electrodes 24 and 25 due to the presence of the access resistance $R_1$. If the structure is ring-shaped as shown in the top view of FIG. 2B, the resistance of the above pinched region will be:

$$R_1 = r/2\pi \; \text{Log}(d2/d1)$$

where
r designates the resistance per square of the P layer 22,
d1 designates the diameter of the junction region between layers 21 and 23, and
d2 designates the diameter of the substantially horizontal junction region between regions 21 and 22.

In order to reduce the value of $R_1$, d1/d2 should approach 1. However, it is not possible to freely select these values because they are imposed by the fact, on the one hand, that the diameter d1 has to be as small as possible to obtain a high current density at the junction to prevent the avalanche diode from being noisy and, on the other hand, that the difference between values d1 and d2 is fixed by technological parameters and especially by the positioning accuracy of two successive masks.

Thus, an object of the invention is to provide a new avalanche diode structure implementable in an integrated circuit and using no additional manufacturing steps other than the steps normally provided for in a bipolar integrated circuit, this structure being such that the access resistance to the avalanche diode is reduced.

SUMMARY OF THE INVENTION

To achieve this object, the invention provides an avalanche diode formed in a bipolar integrated circuit comprising, in a layer of the first conductivity type having a first surface, a first region of the second conductivity type extending from the first surface, and a region of the first conductivity type arranged inside the first region so that the portion of the first region disposed under the region of the first conductivity type and close to the interface with the latter has a first doping level. A second region of the second conductivity type extends under the region of the first conductivity type with a second doping level higher than the first close to the junction. A third region of the second conductivity type is disposed under the region of the first conductivity type and overlaps with respect to the second region of the second conductivity type. The third region has, at its interface with the region of the first conductivity type, a doping level intermediate the first and second doping levels.

According to an embodiment of the invention, the layer of the first conductivity type corresponds to the N-type epitaxial layer of the bipolar integrated circuit; the first region corresponds to the P-type base regions of the NPN transistors of the bipolar integrated circuit; the second region corresponds to the P-type emitter regions of the PNP transistors of the bipolar integrated circuit; the third region corresponds to the P-type insulation diffusion of the bipolar integrated circuit; and the region of the first conductivity type corresponds to the emitter regions of the NPN transistors of the bipolar integrated circuit. These various regions preferably have circular outlines.

BRIEF DESCRIPTION OF THE DRAWINGS

The foregoing and other objects, features and advantages of the invention will be apparent from the following detailed description of a preferred embodiment as illustrated in the accompanying figures wherein.

As conventional in integrated circuit representation, the various drawings are very schematic and not drawn to scale. Especially, the curved shapes of the junction edges resulting from diffusions do not correspond to actual shapes.

DETAILED DESCRIPTION OF THE INVENTION

Figure 2:
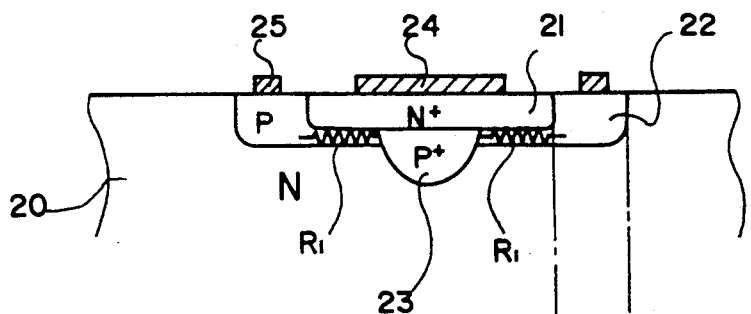
FIGS. 2A and 2B are side and top views of a conventional avalanche diode structure used in a bipolar integrated circuit.
Figure 2:
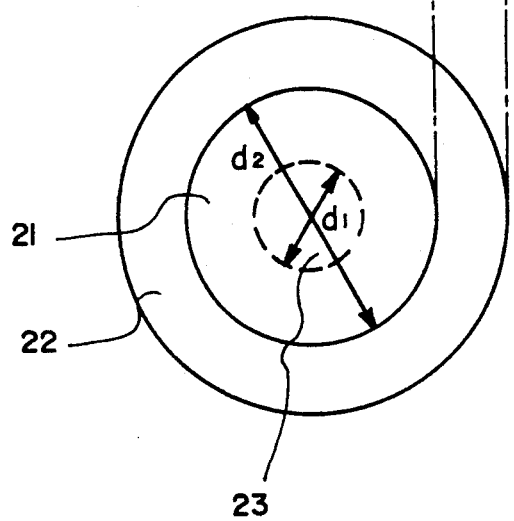
Figure 3A:
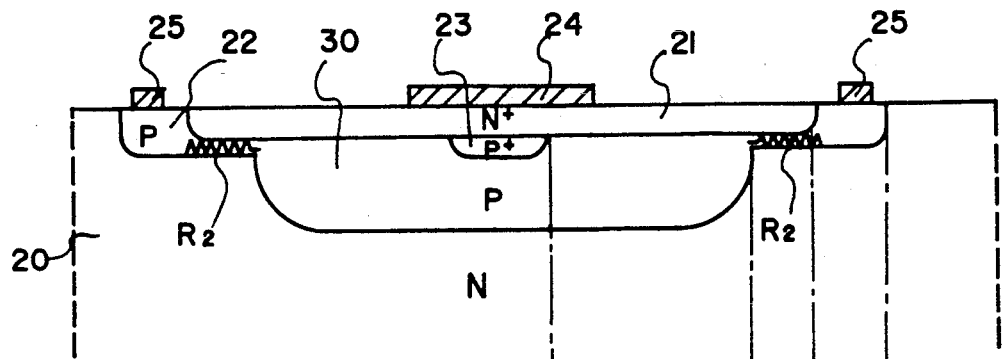
FIGS. 3A and 3B are side and top views of an avalanche diode according to the invention.
Figure 3B:
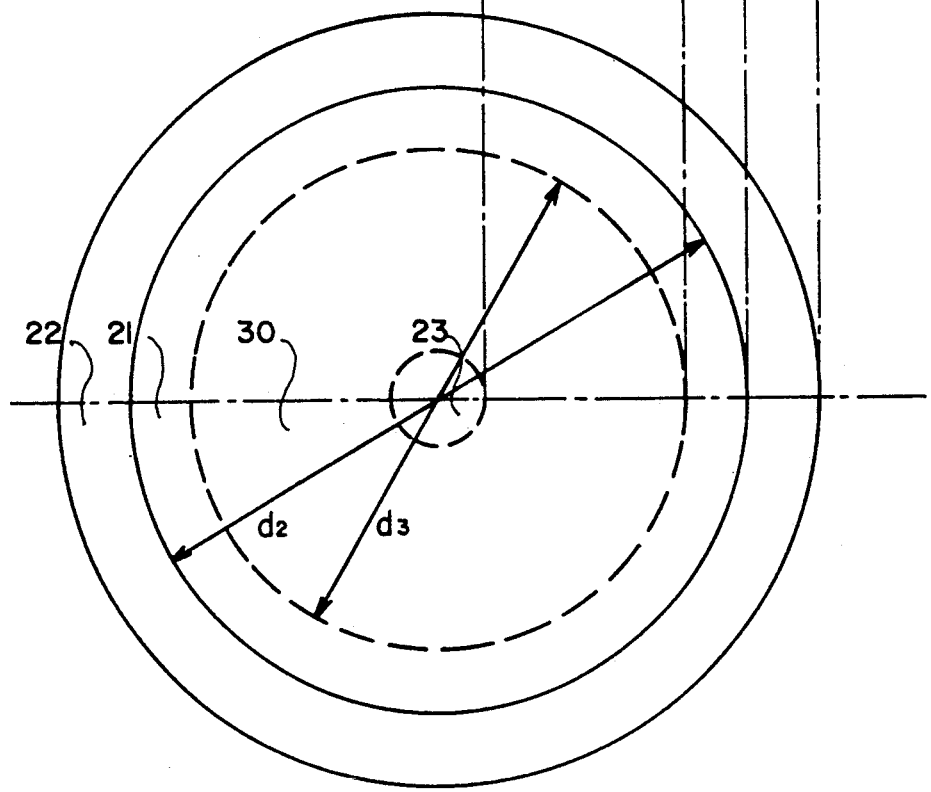

In FIGS. 3A and 3B, regions and areas analogous to those illustrated in FIGS. 2A and 2B are designated with same references. Thus, they show the P base layer 22, the P+-type region 23 forming an avalanche junction with the N+ region 21 and metallizations 24 and 25 respectively fixed to the N+ region 21 and the P region 22. Moreover, there is a P region 30 appearing under the N+ region 21 without overlapping the latter and surrounding the P+ region 23. This P region 30 results from a diffusion such that its doping level close to its interface with region 21 is lower than the doping level of region 23 close to its interface with region 21, while being higher than that of the P region 22.

As above, the junction liable to be set to the avalanche mode is the junction formed between regions 23 and 21. The current path from region 23 to metallization 25 first passes through the P region 30 which is a relatively highly doped and thick region and which therefore has a negligible resistance. However, there still remains a pinched region of the P region 22 between the N+ region 21 and the substrate 20 designated by resistance $R_2$. In this case, the resistance of the pinched region will be $$R_2 = (r/2\pi) \text{Log}(d2/d3),$$

where
d2 designates the diameter of the N region 21 and
d3 the diameter of the P region 30 at its interface with the N region 21.

With this structure, it is possible to keep a small surface junction between regions 21 and 23 and to have the ratio between the values d3/d2 as close as possible to 1, to decrease resistance $R_2$, by increasing the size of the P region 30 and therefore correlatively of the N+ region 21.

It will be noted that it is essential that the N region 21 overlaps the P region 30, failing which the junction between regions 21 and 30 could, at the upper surface, be set to avalanche mode before the junction between regions 21 and 23.

Figure 1:
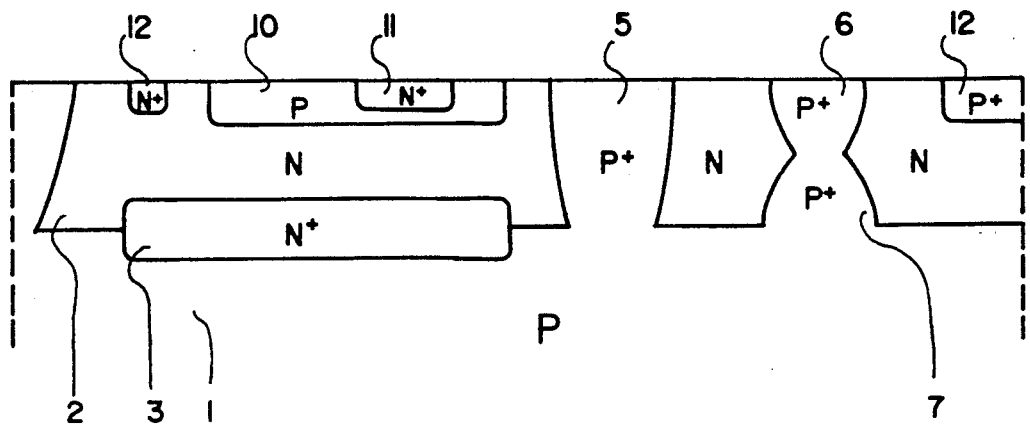
FIG. 1 shows various aspects of a conventional bipolar integrated circuit.
Figure 4:
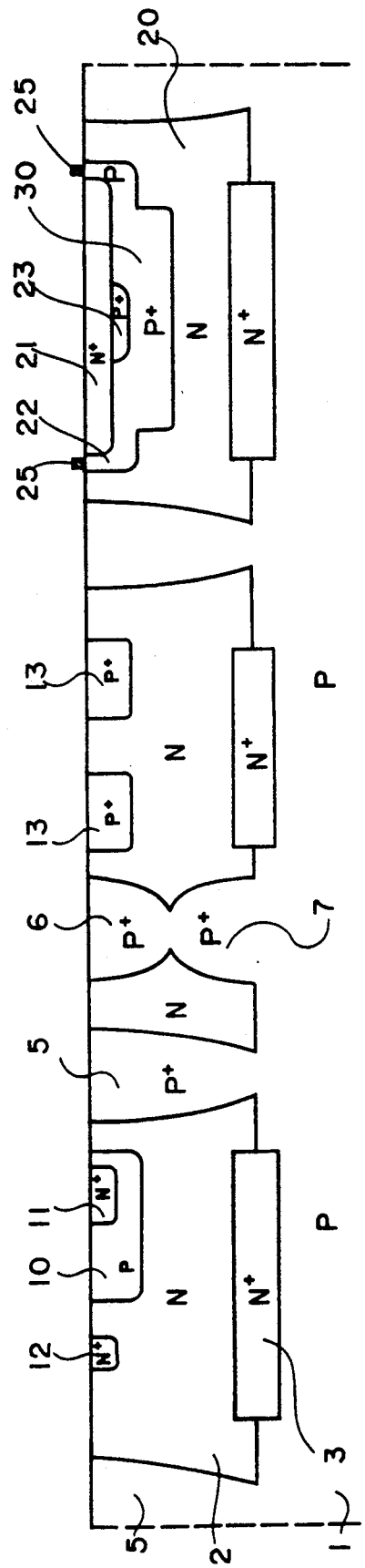
FIG. 4 is a side view showing a portion of a bipolar integrated circuit combining the elements of FIGS. 1 and 3.

As shown in FIG. 4, the structure described according to the invention is perfectly compatible with the manufacturing process of a bipolar integrated circuit such as illustrated in FIG. 1. Indeed, the P region 30 can be a region corresponding to a P insulation diffusion (that can be stopped by a buried layer if insulation is entirely made from the surface), the P+ region 23 can be a region corresponding to the emitter diffusions of PNP power transistors, and the P region 22 a region corresponding to the base diffusion of NPN transistors. In practice, these successive regions are manufactured according to the above sequence; then, the N+ region 21, having the highest doping level among all the above mentioned regions, is formed.

Of course, the invention is liable of numerous variants which will appear to those skilled in the art. Especially, while the top view shows a circular-shaped structure with a central cathode electrode and an annular anode electrode, this structure can have any other shape. For example, the various regions can be square regions interlocked into each other, rectangular regions, digitized regions, etc., the parameters guiding those skilled in the art for manufacturing a structure according to the invention being a small junction surface between regions 21 and 23 and a decrease of the difference d2−d3, which is inherent in the mask alignment requirements in the considered technology.

As exemplary values, the depth of an N emitter region can be about 3 μm; the diffusion depth of a P base region of about 3.3 μm and its resistance per square about 120 ohms, which leads in the case of a structure according to the prior art to a pinched base resistance of about 4 kohms. But, the resistance per square of a P region such as the P region 30 of FIG. 3A can be about 40 ohms.

In practice, the following values can be chosen in the following range:

|  | Surface concentration (cm$^{-3}$) | Depth of junction |
|---|---|---|
| N+ region 21 | $10^{20}$–$10^{21}$ | 1–5 μm |
| P+ region 30 | $10^{18}$–$8 \times 10^{19}$ | 10–20 μm |
| P+ region 23 | $10^{19}$–$10^{20}$ | 5–15 μm |
| P region 22 | $10^{18}$–$10^{19}$ | 1–5 μm |
| | Φ of patterns in oxide prior to diffusion | |
| P+ region 23 | 0.3–20 μm | |
| P+ region 30 | 1–50 μm | |
| N+ region 21 | 2–200 μm | | and can for example be:

|  | Surface concentration (cm$^{-3}$) | Depth of junction |
|---|---|---|
| N+ region 21 | $2 \times 10^{20}$ | 2.5 μm |
| P+ region 30 | $2.5 \times 10^{19}$ | 15 μm |
| P+ region 23 | $4 \times 10^{19}$ | 7 μm |
| P region 22 | $3 \times 10^{18}$ | 2.8 μm |
| | Φ of patterns in oxide prior to diffusion | Φ, including lateral diffusion |
| P+ region 23 | 6 μm | 20 μm |
| P+ region 30 | 30 μm | 60 μm |
| N+ region 21 | 57 μm | 62 μm |

P diffusion 22 will be sufficient in order to contain region 21. It is not necessarily circular.

It will be noted that the surface concentrations of P+ regions 23 and 30 are not very different; but, since the diffusion depths are very different, the concentrations at a depth of 2.5 μm, that is, at the interface with N+ region 21, are also very different.

I claim:
1. An avalanche diode, comprising:
   a semiconductor layer of a first conductivity type having a major surface;
   a first region of a second conductivity type extending from said major surface;
   a second region of the first conductivity type inside said first region and extending from said major surface;
   a third region of the second conductivity type beneath said second region;
   a fourth region of the second conductivity type formed beneath and bounded by said second region in a direction parallel to said major surface and at least partially surrounding said third region;
   first, second and third interfaces being formed, respectively, between said first and second regions, between said second and fourth regions and between said second and third regions;
   wherein said first region near said first interface is of a first impurity concentration, said fourth region near said second interface is of a second impurity concentration greater than said first and said third region near said third interface is of a third impurity concentration greater than said second; and
   electrodes on the major surface of said layer for making contact with said first and third regions.

2. The avalanche diode of claim 1, wherein said layer comprises an epitaxial layer formed on a semiconductor substrate.

3. The avalanche diode of claim 1, wherein said diode is a component of a bipolar integrated circuit having NPN and PNP transistors as well as insulation diffusion regions, and wherein said first region corresponds to a P-type base region of said NPN transistor, said third region corresponds to P-type emitter region of said PNP transistor, said fourth region corresponds to P-type insulation diffusions of said integrated circuit and said second region corresponds to an emitter region of said NPN transistor.

4. The avalanche diode of claim 1, wherein said various regions are circular.

* * * * *